US008794065B1

(12) United States Patent
Yang

(10) Patent No.: US 8,794,065 B1
(45) Date of Patent: Aug. 5, 2014

(54) INTEGRATED INERTIAL SENSING APPARATUS USING MEMS AND QUARTZ CONFIGURED ON CRYSTALLOGRAPHIC PLANES

(75) Inventor: Xiao "Charles" Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 373 days.

(21) Appl. No.: 13/035,968

(22) Filed: Feb. 26, 2011

Related U.S. Application Data

(60) Provisional application No. 61/308,941, filed on Feb. 27, 2010.

(51) Int. Cl.
G01P 1/02 (2006.01)
G01C 19/56 (2012.01)

(52) U.S. Cl.
USPC .......... 73/493; 73/510; 73/504.12; 73/504.16

(58) Field of Classification Search
USPC ............ 73/510, 493, 504.12, 504.16, 514.32, 73/504.14
See application file for complete search history.

(56) References Cited

U.S. PATENT DOCUMENTS

| | | | |
|---|---|---|---|
| 3,614,677 A | 10/1971 | Wilfinger | |
| 4,954,698 A | 9/1990 | Yasunaga et al. | |
| 5,140,745 A | 8/1992 | McKenzie | |
| 5,157,841 A | 10/1992 | Dinsmore | |
| 5,173,597 A | 12/1992 | Anglin | |
| 5,488,765 A | 2/1996 | Kubota et al. | |
| 5,493,769 A | 2/1996 | Sakai et al. | |
| 5,610,414 A | 3/1997 | Yoneda et al. | |
| 5,668,033 A | 9/1997 | Ohara | |
| 5,729,074 A | 3/1998 | Shiomi et al. | |
| 6,046,409 A | 4/2000 | Ishii et al. | |
| 6,076,731 A | 6/2000 | Terrell | |
| 6,115,261 A * | 9/2000 | Platt et al. | 361/760 |
| 6,188,322 B1 | 2/2001 | Yao et al. | |
| 6,263,736 B1 | 7/2001 | Thunder et al. | |
| 6,278,178 B1 | 8/2001 | Kwon et al. | |
| 6,480,699 B1 | 11/2002 | Lovoi | |
| 6,483,172 B1 | 11/2002 | Cote | |
| 6,485,273 B1 | 11/2002 | Goodwin-Johansson | |
| 6,534,726 B1 | 3/2003 | Okada et al. | |
| 6,576,999 B2 | 6/2003 | Sakai et al. | |
| 6,656,604 B2 | 12/2003 | Hasewaga | |
| 6,753,664 B2 | 6/2004 | Neufeld et al. | |
| 6,855,572 B2 | 2/2005 | Jeung et al. | |
| 6,912,336 B2 | 6/2005 | Ishii | |
| 6,933,165 B2 | 8/2005 | Musolf et al. | |

(Continued)

OTHER PUBLICATIONS

International Search Report and Written Opinion of PCT Application No. PCT/US10/054567, mailed on Jan. 6, 2011, 7 pages total.

(Continued)

*Primary Examiner* — Helen Kwok
(74) *Attorney, Agent, or Firm* — Kilpatrick Townsend & Stockton LLP

(57) ABSTRACT

An apparatus for inertial sensing. The apparatus includes a substrate member comprising a thickness of silicon. The apparatus also has a first surface region configured from a first crystallographic plane of the substrate and a second plane region configured from a second crystallographic plane of the substrate. The apparatus has a quartz inertial sensing device coupled to the first surface region, and one or more MEMS inertial sensing devices coupled to the second plane region.

31 Claims, 12 Drawing Sheets

(56) References Cited

U.S. PATENT DOCUMENTS

| | | | |
|---|---|---|---|
| 6,979,872 B2 | 12/2005 | Borwick et al. | |
| 7,019,434 B2 | 3/2006 | Helmbrecht | |
| 7,095,226 B2 | 8/2006 | Wan et al. | |
| 7,145,555 B2 | 12/2006 | Taylor et al. | |
| 7,183,630 B1 | 2/2007 | Fogelson et al. | |
| 7,193,312 B2 | 3/2007 | Boon et al. | |
| 7,195,945 B1 | 3/2007 | Edelstein et al. | |
| 7,239,000 B2 | 7/2007 | Witcraft | |
| 7,253,079 B2 * | 8/2007 | Hanson et al. | 438/417 |
| 7,258,009 B2 | 8/2007 | Imai | |
| 7,358,724 B2 | 4/2008 | Taylor et al. | |
| 7,370,530 B2 * | 5/2008 | DCamp et al. | 73/493 |
| 7,391,091 B2 | 6/2008 | Tondra | |
| 7,402,449 B2 | 7/2008 | Fukuda et al. | |
| 7,430,674 B2 | 9/2008 | Van Mueller et al. | |
| 7,454,705 B2 | 11/2008 | Cadez et al. | |
| 7,456,042 B2 | 11/2008 | Stark | |
| 7,493,496 B2 | 2/2009 | Smith et al. | |
| 7,498,715 B2 | 3/2009 | Yang | |
| 7,511,379 B1 | 3/2009 | Flint | |
| 7,514,760 B1 | 4/2009 | Quevy | |
| 7,521,783 B2 | 4/2009 | Tsai et al. | |
| 7,536,909 B2 * | 5/2009 | Zhao et al. | 73/493 |
| 7,585,750 B2 | 9/2009 | Do et al. | |
| 7,599,277 B1 | 10/2009 | Kato et al. | |
| 7,612,443 B1 | 11/2009 | Bernstein et al. | |
| 7,671,478 B2 | 3/2010 | Wathanawasam et al. | |
| 7,676,340 B2 | 3/2010 | Yasui | |
| 7,690,255 B2 * | 4/2010 | Gogoi et al. | 73/514.32 |
| 7,708,189 B1 | 5/2010 | Cipriano | |
| 7,713,785 B1 | 5/2010 | Flint | |
| 7,779,689 B2 * | 8/2010 | Li et al. | 73/510 |
| 7,814,791 B2 * | 10/2010 | Andersson et al. | 73/504.03 |
| 7,814,792 B2 * | 10/2010 | Tateyama et al. | 73/504.12 |
| 7,814,793 B2 * | 10/2010 | Sato | 73/504.12 |
| 7,861,422 B2 | 1/2011 | MacDonald | |
| 7,891,103 B2 | 2/2011 | Mayor | |
| 8,011,577 B2 | 9/2011 | Mullen et al. | |
| 8,016,191 B2 | 9/2011 | Bonale et al. | |
| 8,037,758 B2 * | 10/2011 | Sato | 73/504.12 |
| 8,056,412 B2 * | 11/2011 | Rutkiewicz et al. | 73/493 |
| 8,061,049 B2 | 11/2011 | Mayor | |
| 8,070,055 B2 | 12/2011 | Block et al. | |
| 8,087,296 B2 * | 1/2012 | Ueda et al. | 73/504.16 |
| 8,140,358 B1 | 3/2012 | Ling et al. | |
| 8,148,808 B2 | 4/2012 | Braden et al. | |
| 8,165,323 B2 | 4/2012 | Zhou | |
| 8,181,874 B1 | 5/2012 | Wan et al. | |
| 8,227,285 B1 | 7/2012 | Yang | |
| 8,236,577 B1 | 8/2012 | Hsu | |
| 8,245,923 B1 | 8/2012 | Merrill et al. | |
| 8,250,921 B2 | 8/2012 | Nasiri et al. | |
| 8,259,311 B2 | 9/2012 | Petschko | |
| 8,324,047 B1 | 12/2012 | Yang | |
| 8,342,021 B2 * | 1/2013 | Oshio | 73/493 |
| 8,367,522 B1 | 2/2013 | Yang | |
| 8,395,252 B1 * | 3/2013 | Yang | 257/687 |
| 8,395,381 B2 | 3/2013 | Lo | |
| 8,402,666 B1 | 3/2013 | Hsu et al. | |
| 8,407,905 B1 | 4/2013 | Hsu et al. | |
| 8,421,082 B1 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan et al. | |
| 2001/0053565 A1 | 12/2001 | Khoury | |
| 2002/0072163 A1 | 6/2002 | Wong et al. | |
| 2002/0134837 A1 | 9/2002 | Kishon | |
| 2003/0058069 A1 | 3/2003 | Schwartz et al. | |
| 2003/0095115 A1 | 5/2003 | Brian et al. | |
| 2003/0133489 A1 | 7/2003 | Hirota et al. | |
| 2003/0184189 A1 | 10/2003 | Sinclair | |
| 2003/0230802 A1 | 12/2003 | Poo et al. | |
| 2004/0002808 A1 | 1/2004 | Hashimoto et al. | |
| 2004/0016995 A1 | 1/2004 | Kuo et al. | |
| 2004/0017644 A1 | 1/2004 | Goodwin-Johansson | |
| 2004/0056742 A1 | 3/2004 | Dabbaj | |
| 2004/0063325 A1 | 4/2004 | Urano et al. | |
| 2004/0104268 A1 | 6/2004 | Bailey | |
| 2004/0113246 A1 | 6/2004 | Boon | |
| 2004/0119836 A1 | 6/2004 | Kitaguchi et al. | |
| 2004/0140962 A1 | 7/2004 | Wang et al. | |
| 2004/0177045 A1 | 9/2004 | Brown | |
| 2004/0207035 A1 | 10/2004 | Witcraft et al. | |
| 2004/0227201 A1 | 11/2004 | Borwick et al. | |
| 2005/0074147 A1 | 4/2005 | Smith et al. | |
| 2005/0090038 A1 | 4/2005 | Wallace | |
| 2005/0174338 A1 | 8/2005 | Ing | |
| 2005/0199791 A1 | 9/2005 | Sengoku et al. | |
| 2005/0247787 A1 | 11/2005 | Von Mueller et al. | |
| 2005/0252293 A1 | 11/2005 | Won et al. | |
| 2006/0049826 A1 | 3/2006 | Daneman et al. | |
| 2006/0081954 A1 | 4/2006 | Tondra et al. | |
| 2006/0141786 A1 | 6/2006 | Boezen et al. | |
| 2006/0168832 A1 | 8/2006 | Yasui et al. | |
| 2006/0192465 A1 | 8/2006 | Kornbluh et al. | |
| 2006/0208326 A1 | 9/2006 | Nasiri et al. | |
| 2006/0211044 A1 | 9/2006 | Green | |
| 2006/0238621 A1 | 10/2006 | Okubo et al. | |
| 2006/0243049 A1 * | 11/2006 | Ohta et al. | 73/504.12 |
| 2006/0274399 A1 | 12/2006 | Yang | |
| 2007/0046239 A1 | 3/2007 | Hashizume | |
| 2007/0132733 A1 | 6/2007 | Ram | |
| 2007/0152976 A1 | 7/2007 | Townsend et al. | |
| 2007/0181962 A1 | 8/2007 | Partridge et al. | |
| 2007/0200564 A1 | 8/2007 | Motz et al. | |
| 2007/0281379 A1 | 12/2007 | Stark et al. | |
| 2008/0014682 A1 | 1/2008 | Yang et al. | |
| 2008/0066547 A1 * | 3/2008 | Tanaka et al. | 73/504.16 |
| 2008/0110259 A1 | 5/2008 | Takeno | |
| 2008/0119000 A1 | 5/2008 | Yeh et al. | |
| 2008/0123242 A1 | 5/2008 | Zhou | |
| 2008/0210007 A1 | 9/2008 | Yamaji et al. | |
| 2008/0211043 A1 | 9/2008 | Chen | |
| 2008/0211113 A1 | 9/2008 | Chua et al. | |
| 2008/0211450 A1 | 9/2008 | Yamada et al. | |
| 2008/0277747 A1 | 11/2008 | Ahmad | |
| 2008/0283991 A1 | 11/2008 | Reinert | |
| 2009/0007661 A1 | 1/2009 | Nasiri et al. | |
| 2009/0015251 A1 | 1/2009 | Azumi et al. | |
| 2009/0049911 A1 | 2/2009 | Fukuda et al. | |
| 2009/0108440 A1 | 4/2009 | Meyer et al. | |
| 2009/0115412 A1 | 5/2009 | Fuse | |
| 2009/0153500 A1 | 6/2009 | Cho et al. | |
| 2009/0262074 A1 | 10/2009 | Nasiri et al. | |
| 2009/0267906 A1 | 10/2009 | Schroderus | |
| 2009/0307557 A1 | 12/2009 | Rao et al. | |
| 2009/0321510 A1 | 12/2009 | Day et al. | |
| 2010/0044121 A1 | 2/2010 | Simon et al. | |
| 2010/0045282 A1 | 2/2010 | Shibasaki et al. | |
| 2010/0071467 A1 * | 3/2010 | Nasiri et al. | 73/504.12 |
| 2010/0075481 A1 | 3/2010 | Yang | |
| 2010/0083756 A1 | 4/2010 | Merz et al. | |
| 2010/0095769 A1 | 4/2010 | Matsumoto et al. | |
| 2010/0109102 A1 | 5/2010 | Chen et al. | |
| 2010/0171570 A1 | 7/2010 | Chandrahalim | |
| 2010/0208118 A1 | 8/2010 | Ueyama | |
| 2010/0236327 A1 | 9/2010 | Mao | |
| 2010/0248662 A1 | 9/2010 | Sheynblat et al. | |
| 2010/0260388 A1 | 10/2010 | Garret et al. | |
| 2010/0302199 A1 | 12/2010 | Taylor et al. | |
| 2010/0306117 A1 | 12/2010 | Terayoko | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0146401 A1 | 6/2011 | Inaguma et al. | |
| 2011/0154905 A1 | 6/2011 | Hsu | |
| 2011/0172918 A1 | 7/2011 | Tome | |
| 2011/0183456 A1 | 7/2011 | Hsieh et al. | |
| 2011/0198395 A1 | 8/2011 | Chen | |
| 2011/0265574 A1 * | 11/2011 | Yang | 73/658 |
| 2011/0266340 A9 | 11/2011 | Block et al. | |
| 2011/0312349 A1 | 12/2011 | Forutanpour et al. | |

(56) References Cited

U.S. PATENT DOCUMENTS

2012/0007597 A1 1/2012 Seeger et al.
2012/0007598 A1 1/2012 Lo et al.
2012/0215475 A1 8/2012 Rutledge et al.

OTHER PUBLICATIONS

Notice of Allowance for U.S. Appl. No. 12/717,070, mailed on Mar. 9, 2012, 9 pages.
Office Action for U.S. Appl. No. 12/945,087, mailed on Mar. 19, 2012, 6 pages.
U.S. Appl. No. 12/913,440, Final Office Action mailed Oct. 10, 2013, 10 pages.
U.S. Appl. No. 12/944,712 Final Office Action mailed Aug. 21, 2013, 15 pages.
U.S. Appl. No. 12/983,309 Notice of Allowance mailed Aug. 13, 2013, 11 pages.
U.S. Appl. No. 13/924,457 Notice of Allowance mailed Sep. 18, 2013, 11 pages.
U.S. Appl. No. 13/035,969 Non-Final Office Action mailed Oct. 25, 2013, 11 pages.
U.S. Appl. No. 13/751,014 Notice of Allowance mailed Jul. 31, 2013, 9 pages.
U.S. Appl. No. 12/787,368 Non-Final Office Action mailed Sep. 19, 2013, 19 pages.
U.S. Appl. No. 13/922,983 Notice of Allowance mailed Oct. 7, 2013, 10 pages.
U.S. Appl. No. 12/787,200 Notice of Allowance mailed Sep. 26, 2013, 11 pages.
U.S. Appl. No. 13/177,053 Non-Final Office Action mailed Sep. 18, 2013, 12 pages.
U.S. Appl. No. 13/164,311 Notice of Allowance mailed Sep. 17, 2013, 8 pages.
U.S. Appl. No. 13/163,672 Non-Final Office Action mailed Sep. 5, 2013, 7 pages.
U.S. Appl. No. 12/940,025 Notice of Allowance mailed Oct. 17, 2013, 10 pages.
U.S. Appl. No. 13/069,355 Final Office Action mailed Oct. 31, 2013, 15 pages.

* cited by examiner

INTEGRATED INERTIAL SENSING APPARATUS USING MEMS AND QUARTZ CONFIGURED ON CRYSTALLOGRAPHIC PLANES

CROSS-REFERENCES TO RELATED APPLICATIONS

The present application claims priority to and incorporates by reference, for all purposes, the following patent application: U.S. Pat. App. No. 61/308,941, filed Feb. 27, 2010. The present invention also incorporates by reference, for all purposes, the following co-pending patent applications related to CMOS & MEMS devices and IC fabrication methodology: U.S. patent application Ser. No. 12/490,067, filed Jun. 23, 2009, U.S. patent application Ser. No. 12/717,070, filed Mar. 3, 2010, U.S. patent application Ser. No. 12/945,087, filed Nov. 12, 2010, U.S. Pat. App. No. 61/356,467, filed Jun. 18, 2010, and U.S. patent application Ser. No. 12/913,440, filed Oct. 27, 2010.

BACKGROUND OF THE INVENTION

The present invention relates generally to integrated devices. More particularly, the present invention provides a system and method for integrating at least two different micro electro mechanical systems (MEMS), which may optionally include one or more complementary metal oxide semiconductor (CMOS) devices, but can have others as well. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to electronic and mechanical devices are provided. More particularly, the present invention provides an inertial sensing apparatus that is preferably integrated with one or more integrated circuits and/or other micro-electrical mechanical systems, commonly termed MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, the present invention provides an apparatus for inertial sensing, e.g., an integrated gyroscope and accelerometer device. The apparatus includes a substrate member including a thickness of material. In an embodiment, the apparatus also has a first surface region configured from a first crystallographic plane of the substrate and a second plane region configured from a second crystallographic plane of the substrate. The apparatus has a quartz inertial sensing device coupled to the first surface region, and one or more MEMS inertial sensing devices coupled to the second plane region. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. In one or more preferred embodiments, the present invention uses micro-machining techniques, such as those commonly used in the manufacture of MEMS and/or semiconductor devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related generally to integrated devices and systems are provided. More particularly, the present invention provides a system and method for integrating MEMS devices with other system applications, which may be configured on at least CMOS integrated circuit devices. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
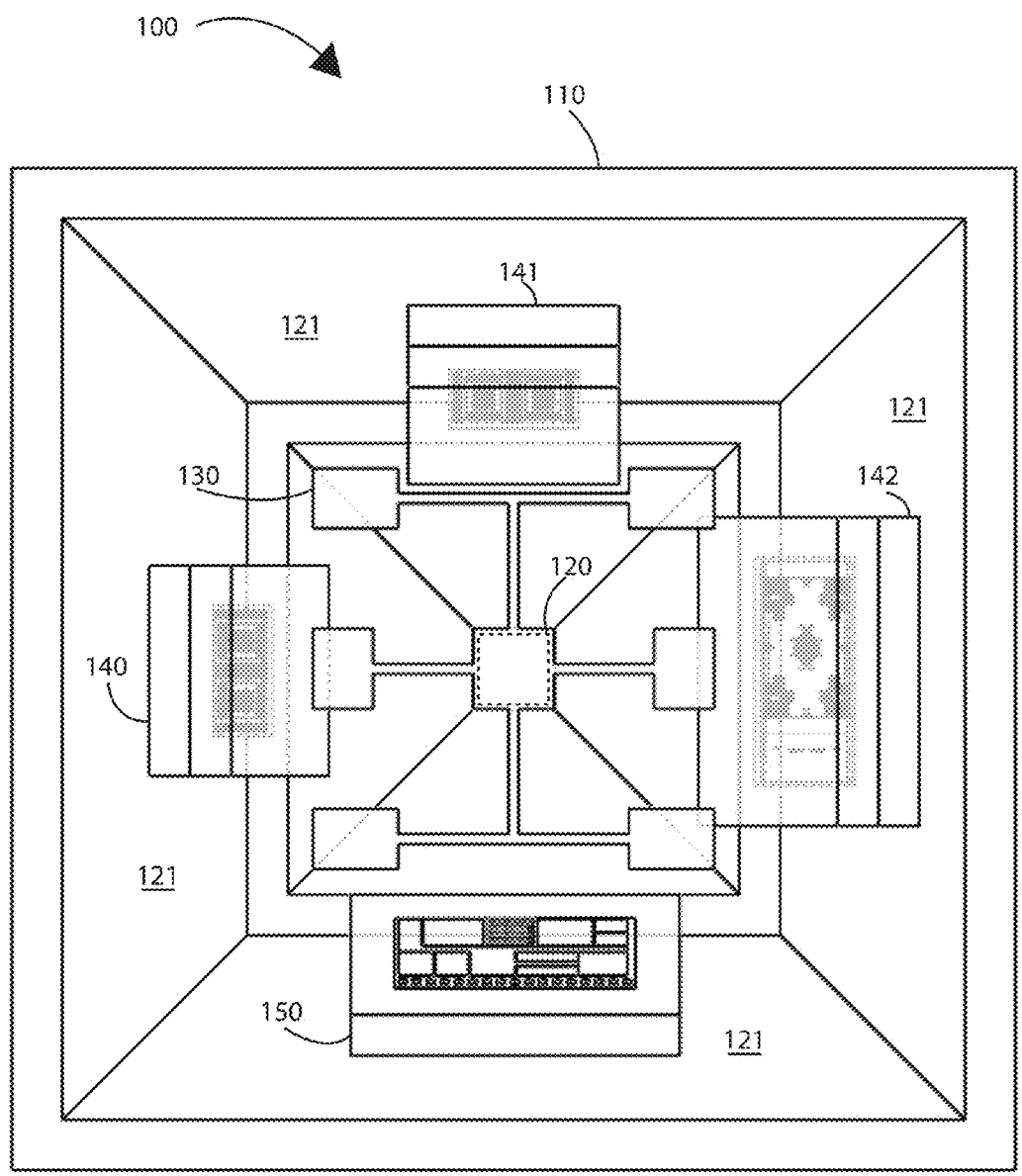
FIG. 1 is a simplified top diagram of a quartz and MEMS inertial sensing apparatus configured on crystallographic planes according to an embodiment of the present invention.

FIG. 1 is a simplified top diagram of a quartz and MEMS inertial sensing apparatus configured on crystallographic planes according to an embodiment of the present invention. This diagram is merely an example, which should not unduly limit the scope of the claims herein. One of ordinary skill in the art would recognize other variations, modifications, and alternatives. As shown, apparatus 100 includes a substrate member 110, a first surface region 120, a second plane region 121, a quartz inertial sensing device 130, one or more MEMS inertial sensing devices 140-142. Those of ordinary skill in the art will recognize other variations, modifications, and alternatives.

In an embodiment, substrate member 110 includes a thickness of material. In a specific embodiment, the thickness of material can be of a silicon material, single crystal silicon material, polysilicon material, or any combination of these materials and others. In an embodiment, first surface region 120 can be configured from a first crystallographic plane of substrate 110. Additionally, second plane region 121 can be configured from a second crystallographic plane of substrate 110. In a specific embodiment, the first crystallographic plane of the substrate and the second crystallographic plane of the substrate are configured at an angle excluding 90 degrees. In another specific embodiment, the first crystallographic plane and the second crystallographic plane form an acute angle of 54.7 degrees, but can form other angles as well. In a preferred embodiment, the acute angle is formed from two natural crystallographic planes, although there may be some slight variations in one or more embodiments. In further embodiments, second plane region 121 can include one or more plane regions configured from the second crystallographic plane. In an embodiment, second plane region 121 can be formed via a wet etching process, a dry etching process, or any type of etching process or combination of etching processes thereof. Of course, there can be variations, modifications, and alternatives.

In an embodiment, quartz inertial sensing device 130 can be coupled to the first surface region. In a specific embodiment, quartz inertial sensing device 130 can be coupled to the first surface region via a bonding or joining process, such as, for example, a quartz soldering process, or any adhesive process, or any combination of these processes. In an embodiment, one or more MEMS inertial sensing devices 140-142 can be coupled to second plane region 121. In a specific embodiment, one or more MEMS inertial sensing devices 140-142 can include at least a portion being configured in a region underlying quartz inertial sensing device 130. Also, one or more MEMS inertial sensing devices 140-142 can be integrated MEMS and IC devices. In a specific embodiment, one or more MEMS inertial sensing devices 140 and 141 can be single-axis MEMS gyroscope devices, but can be others. Also, one or more MEMS inertial sensing devices 142 can be a three-axis accelerometer, but can be others. Those skilled in the art will recognize other variations, modifications, and alternatives.

In an embodiment, apparatus 100 further includes one or more integrated circuit (IC) devices coupled to second plane region 121. In a specific embodiment, one or more IC devices 150 can be application specific integrated circuit (ASIC) devices and can include at least a portion being configured in a region underlying quartz inertial sensing device 130. In further embodiments, one or more IC devices 150 can be coupled to at least quartz inertial sensing device 130. Additionally, one or more IC devices 150 and one or more MEMS devices 140-142 can be configured using a silicon-on-insulator substrate. In further embodiments, the devices that are coupled to first surface region 120 and second plane region 121 can be sealed in a vacuum. Other variations, modifications, and alternatives will be recognized by those of ordinary skill in the art.

It is also understood that the examples and embodiments described herein are for illustrative purposes only and that various modifications or changes in light thereof will be suggested to persons skilled in the art and are to be included within the spirit and purview of this application and scope of the appended claims. Further details of the integration of MEMS devices and quartz devices can be found throughout the present specification and more particularly below.

Figure 2:
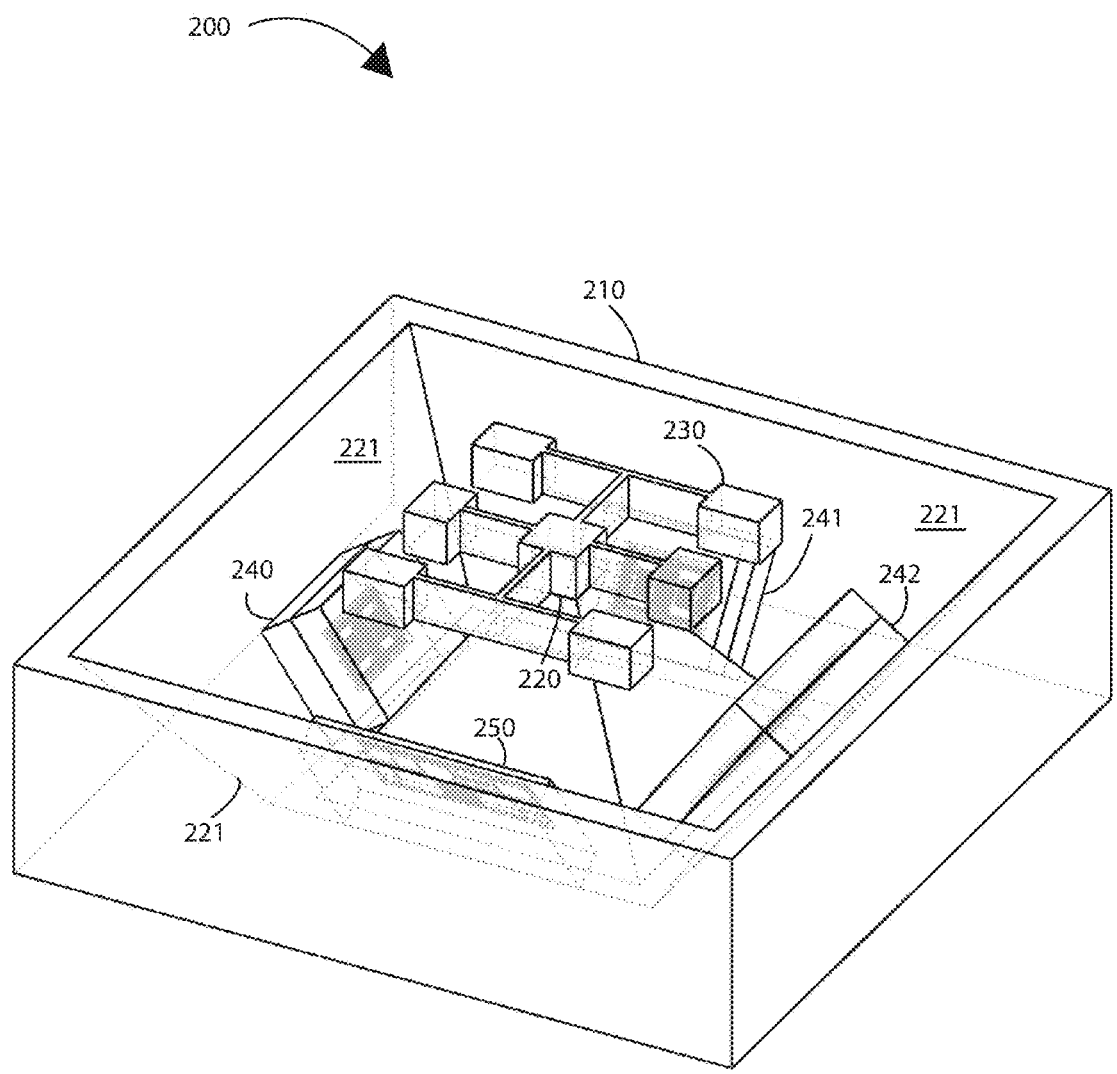
FIG. 2 is a simplified perspective diagram of a quartz and MEMS inertial sensing apparatus configured on crystallographic planes according to an embodiment of the present invention.

FIG. 2 is a simplified perspective diagram of a quartz and MEMS inertial sensing apparatus configured on crystallographic planes according to an embodiment of the present invention. This diagram is merely an example, which should not unduly limit the scope of the claims herein. One of ordinary skill in the art would recognize other variations, modifications, and alternatives. As shown, apparatus 200 includes a substrate member 210, a first surface region 220, a second plane region 221, a quartz inertial sensing device 230, one or more MEMS inertial sensing devices 240-242. Those of ordinary skill in the art will recognize other variations, modifications, and alternatives.

In an embodiment, substrate member 210 includes a thickness of material. In a specific embodiment, the thickness of material can be of a silicon material, single crystal silicon material, polysilicon material, or any combination of these materials and others. In an embodiment, first surface region 220 can be configured from a first crystallographic plane of substrate 210. Additionally, second plane region 221 can be configured from a second crystallographic plane of substrate 210. In a specific embodiment, the first crystallographic plane of the substrate and the second crystallographic plane of the substrate are configured at an angle excluding 90 degrees. In another specific embodiment, the first crystallographic plane and the second crystallographic plane form an acute angle of 54.7 degrees, but can form other angles as well. In a preferred embodiment, the acute angle is formed from two natural crystallographic planes, although there may be some slight variations in one or more embodiments. In further embodiments, second plane region 221 can include one or more plane regions configured from the second crystallographic plane. In an embodiment, second plane region 221 can be formed via a wet etching process, a dry etching process, or any type of etching process or combination of etching processes thereof. Of course, there can be variations, modifications, and alternatives.

In an embodiment, quartz inertial sensing device 230 can be coupled to the first surface region. In a specific embodiment, quartz inertial sensing device 230 can be coupled to the first surface region via a bonding or joining process, such as, for example, a quartz soldering process, or any adhesive process, or any combination of these processes. In an embodiment, one or more MEMS inertial sensing devices 240-242 can be coupled to second plane region 221. In a specific embodiment, one or more MEMS inertial sensing devices 240-242 can include at least a portion being configured in a region underlying quartz inertial sensing device 230. Also, one or more MEMS inertial sensing devices 240-242 can be integrated MEMS and IC devices. In a specific embodiment, one or more MEMS inertial sensing devices 240 and 241 can be single-axis MEMS gyroscope devices, but can be others. Also, one or more MEMS inertial sensing devices 242 can be a three-axis accelerometer, but can be others. Those skilled in the art will recognize other variations, modifications, and alternatives.

In an embodiment, apparatus 200 further includes one or more integrated circuit (IC) devices coupled to second plane region 221. In a specific embodiment, one or more IC devices 250 can be application specific integrated circuit (ASIC) devices and can include at least a portion being configured in a region quartz inertial sensing device 230. In further embodiments, one or more IC devices 250 can be coupled to at least quartz inertial sensing device 230. Additionally, one or more IC devices 250 and one or more MEMS devices 240-242 can be configured using silicon-on-insulator technology. In further embodiments, the devices that are coupled to first surface region 220 and second plane region 221 can be sealed in a vacuum. Other variations, modifications, and alternatives will be recognized by those of ordinary skill in the art.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
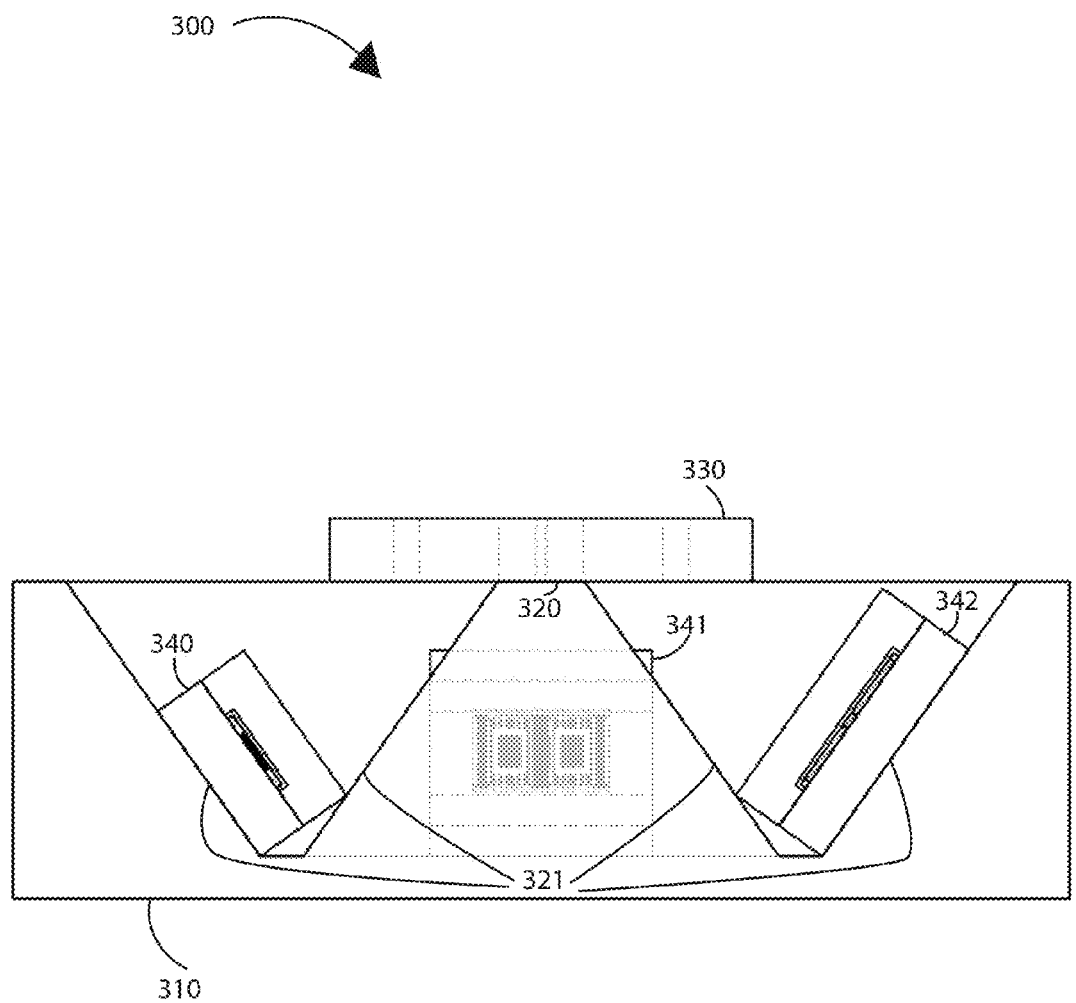
FIG. 3 is a simplified side diagram of a quartz and MEMS inertial sensing apparatus configured on crystallographic planes according to an embodiment of the present invention.

FIG. 3 is a simplified side diagram of a quartz and MEMS inertial sensing apparatus configured on crystallographic planes according to an embodiment of the present invention. This diagram is merely an example, which should not unduly limit the scope of the claims herein. One of ordinary skill in the art would recognize other variations, modifications, and alternatives. As shown, apparatus 300 includes a substrate member 310, a first surface region 320, a second plane region 321, a quartz inertial sensing device 330, one or more MEMS inertial sensing devices 340-342. Those of ordinary skill in the art will recognize other variations, modifications, and alternatives.

In an embodiment, substrate member 310 includes a thickness of material. In a specific embodiment, the thickness of material can be of a silicon material, single crystal silicon material, polysilicon material, or any combination of these materials and others. In an embodiment, first surface region 320 can be configured from a first crystallographic plane of substrate 310. Additionally, second plane region 321 can be configured from a second crystallographic plane of substrate 310. In a specific embodiment, the first crystallographic plane of the substrate and the second crystallographic plane of the substrate are configured at an angle excluding 90 degrees. In another specific embodiment, the first crystallographic plane and the second crystallographic plane form an acute angle of 54.7 degrees, but can form other angles as well. In a preferred embodiment, the acute angle is formed from two natural crystallographic planes, although there may be some slight variations in one or more embodiments. In further embodiments, second plane region 321 can include one or more plane regions configured from the second crystallographic plane. In an embodiment, second plane region 321 can be formed via a wet etching process, a dry etching process, or any type of etching process or combination of etching processes thereof. Of course, there can be variations, modifications, and alternatives.

In an embodiment, quartz inertial sensing device 330 can be coupled to the first surface region. In a specific embodiment, quartz inertial sensing device 330 can be coupled to the first surface region via a bonding or joining process, such as, for example, a quartz soldering process, or any adhesive process, or any combination of these processes. In an embodiment, one or more MEMS inertial sensing devices 340-342 can be coupled to second plane region 321. In a specific embodiment, one or more MEMS inertial sensing devices 340-342 can include at least a portion being configured in a region underlying quartz inertial sensing device 330. Also, one or more MEMS inertial sensing devices 340-342 can be integrated MEMS and IC devices. In a specific embodiment, one or more MEMS inertial sensing devices 340 and 341 can be single-axis MEMS gyroscope devices, but can be others. Also, one or more MEMS inertial sensing devices 342 can be a three-axis accelerometer, but can be others. Those skilled in the art will recognize other variations, modifications, and alternatives.

In an embodiment, apparatus 300 further includes one or more integrated circuit (IC) devices coupled to second plane region 321. In a specific embodiment, one or more IC devices 350 can be application specific integrated circuit (ASIC) devices and can include at least a portion being configured in a region underlying quartz inertial sensing device 330. In further embodiments, one or more IC devices 350 can be coupled to at least quartz inertial sensing device 330. Additionally, one or more IC devices 350 and one or more MEMS devices 340-342 can be configured using silicon-on-insulator technology. In further embodiments, the devices that are coupled to first surface region 320 and second plane region 321 can be sealed in a vacuum. Other variations, modifications, and alternatives will be recognized by those of ordinary skill in the art.

As shown, two or more of the mechanical devices, including at least quartz inertial sensing device 330 and MEMS inertial sensing devices 340-341, occupy a spatial region in a lateral direction, which is smaller than the spatial region of the two or more devices configured in a side by side orientation, as illustrated in the embodiments below (FIGS. 4-9). That is, at least one of MEMS devices (340-341) includes one or more portions that are spatially disposed underlying a portion of quartz inertial sensing device 330. As an example, the two MEMS devices (340 and 341), as shown, include regions underlying quartz device 330 to form a higher density structure, including two MEMS devices 340-341 and quartz inertial device 330. Additionally, IC device 350 can occupy a spatial region in a lateral direction, IC device 350 having a portion being disposed underlying the quartz device 330. This further forms an even higher density structure, including two MEMS devices 340-341, quartz inertial sensing device 330, and IC device 350. Those skilled in the art will recognize other variations, modifications, and alternatives.

In further embodiments, the two or more mechanical devices can have at least a portion being disposed underlying the quartz sensing device 130 on the same physical plane or on separate planes derived from the family of physical planes related to the second crystallographic plane of the substrate 310. That is, the two or more mechanical devices can be disposed on one or more planes that form an angle, excluding 90 degrees, with the first crystallographic plane of the substrate 310. In a preferred embodiment, the two or more mechanical devices can be disposed on one or more planes that form an angle of 54.7 degrees with the first crystallographic plane of the substrate. As shown, second plane region 321 includes 4 plane regions formed by a square etch. One or more mechanical devices can be disposed on each of these planes in order to form a higher density structure. In other embodiments, one or more planes configured from the second crystallographic plane of the substrate can be formed by an etching process to be used to form a higher density structure. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
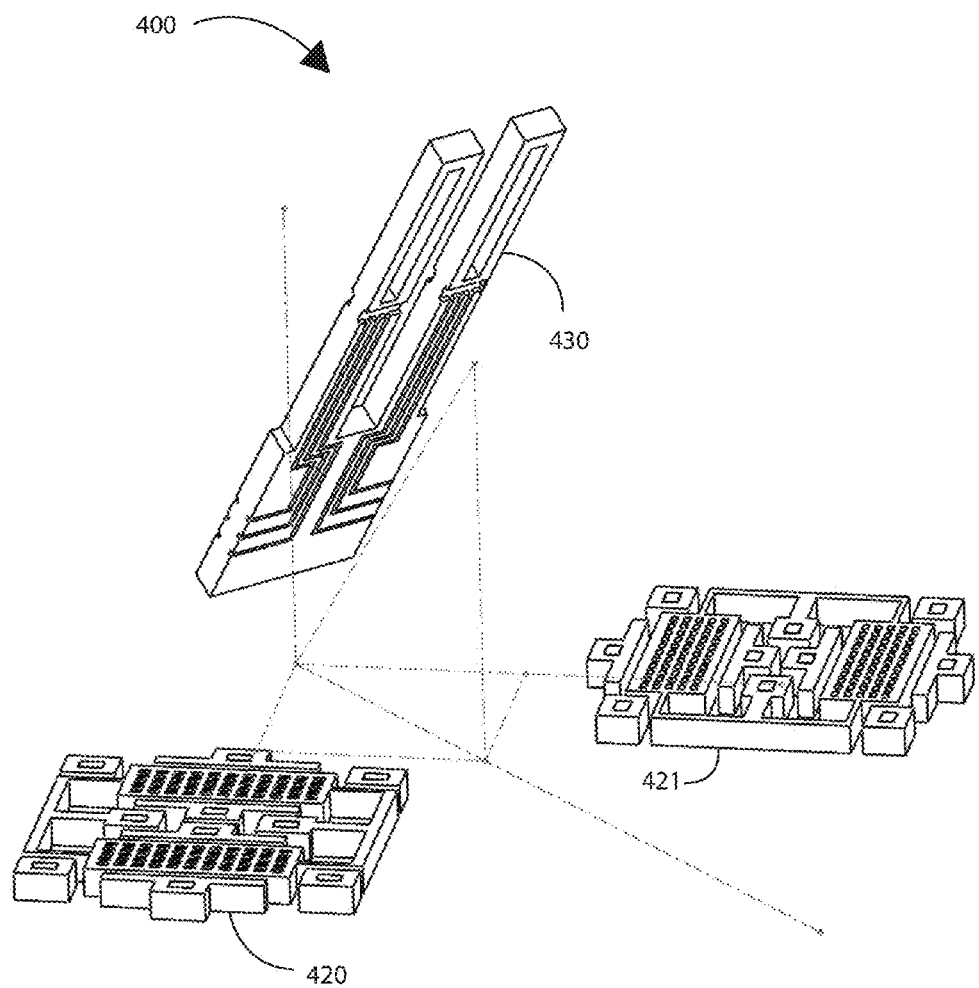
FIG. 4 is a simplified perspective diagram of a quartz and MEMS inertial sensing apparatus according to an embodiment of the present invention.

FIG. 4 is a simplified perspective diagram of a quartz and MEMS inertial sensing apparatus according to an embodiment of the present invention. This diagram is merely an example, which should not unduly limit the scope of the claims herein. One of ordinary skill in the art would recognize other variations, modifications, and alternatives. As shown, system 400 includes a first inertial sensing device 420, a second inertial sensing device 421, and an inertial sensing device 430. Those of ordinary skill in the art will recognize other variations, modifications, and alternatives.

In a specific embodiment, the inertial sensing device 430 can be operably coupled to both first sensing device 420 and the second sensing device 421. In other embodiments, inertial sensing device 430 can be coupled to only first sensing device 420 or second sensing device 421. In further embodiments, inertial sensing device 430 can be configured independently of first sensing device 420 and second sensing device 421. In a specific embodiment, first inertial sensing device 420 and second inertial sensing device 421 can be configured on the same spatial plane, such as an X-Y plane or Y-Z plane, and oriented in a perpendicular pattern on the spatial plane. In other embodiments, first sensing device 420 and second sensing device 421 can be oriented in any other pattern on the same spatial plane. In further embodiments, first sensing device 420 and second sensing device 421 can be configured on separate spatial planes (i.e., X-Y, Y-Z, X-Z), although the reference coordinates may be different. In a specific embodiment, inertial sensing device 430 can be spatially disposed between the first sensing device 420 and the second sensing device 421. In a specific embodiment, inertial sensing device 430 can be configured to be spatially disposed between the first sensing device 420 and second sensing device 421 at an angle of 54.7 degrees, but can be others. In other specific embodiments, inertial sensing device 430 can be configured at other angles. In a specific embodiment, one or more modules can be coupled to first sensing device 420, second sensing device 421, and inertial sensing device 430. Of course, there can be other variations, modifications, and alternatives.

In a specific embodiment, first sensing device 420 can be configured to detect at least a first direction and second sensing device 421 can be configured to detect at least a second direction. Inertial sensing device 430 can also be configured to detect at least a third direction. In other embodiments, each sensing device (420, 421, and 430) can be configured to detect one or more directions. In a specific embodiment, the one or more modules can be configured to calibrate at least first inertial sensing device 420 to inertial sensing device 430.

The one or more modules can also be configured to calibrate at least second sensing device 421 to inertial sensing device 430. In other specific embodiments, the one or more modules can be configured to associate at least first sensing device 420 to inertial sensing device 430. The one or more modules can also be configured to associate at least second sensing device 421 to inertial sensing device 430. Those skilled in the art will recognize other variations, modifications, and alternatives.

In a specific embodiment, first sensing device 420 is a first gyroscope and second sensing device 421 is a second gyroscope device. The first gyroscope and the second gyroscope can comprise at least a first material such as silicon (single crystalline, polycrystalline, amorphous, etc.), or any other material and combinations thereof. Also, inertial sensing device 430 can include a quartz substrate member, or a member comprising other materials or a combination thereof. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
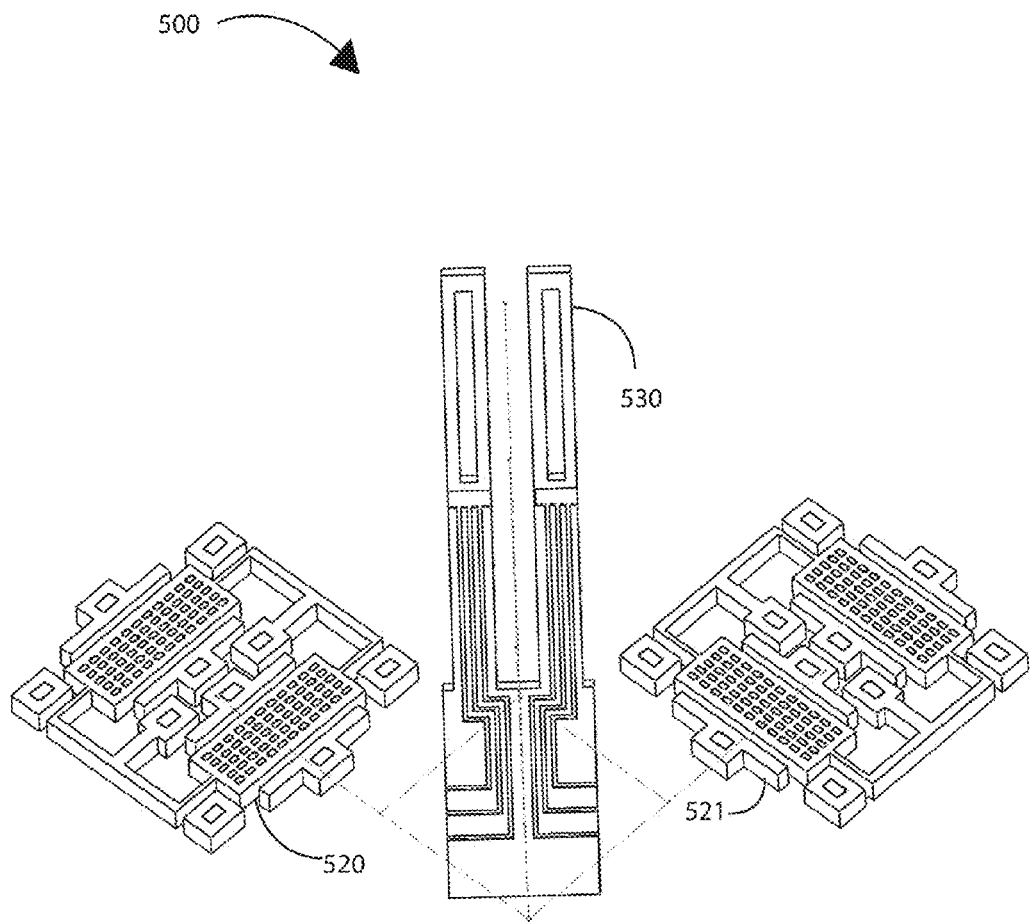
FIG. 5 is a simplified top diagram of a quartz and MEMS inertial sensing apparatus according to an embodiment of the present invention.

FIG. 5 is a simplified top diagram of a quartz and MEMS inertial sensing apparatus according to an embodiment of the present invention. This diagram is merely an example, which should not unduly limit the scope of the claims herein. One of ordinary skill in the art would recognize other variations, modifications, and alternatives. As shown, system 500 includes a first inertial sensing device 520, a second inertial sensing device 521, and an inertial sensing device 530. Those of ordinary skill in the art will recognize other variations, modifications, and alternatives.

In a specific embodiment, the inertial sensing device 530 can be operably coupled to both first sensing device 520 and the second sensing device 521. In other embodiments, inertial sensing device 530 can be coupled to only first sensing device 520 or second sensing device 521. In further embodiments, inertial sensing device 530 can be configured independently of first sensing device 520 and second sensing device 521. In a specific embodiment, first inertial sensing device 520 and second inertial sensing device 521 can be configured on the same spatial plane, such as an X-Y plane or Y-Z plane, and oriented in a perpendicular pattern on the spatial plane. In other embodiments, first sensing device 520 and second sensing device 521 can be oriented in any other pattern on the same spatial plane. In further embodiments, first sensing device 520 and second sensing device 521 can be configured on separate spatial planes (i.e., X-Y, Y-Z, X-Z). In a specific embodiment, inertial sensing device 530 can be spatially disposed between first sensing device 520 and second sensing device 521. In a specific embodiment, inertial sensing device 530 can be configured to be spatially disposed between the first sensing device 520 and second sensing device 521 at an angle of 54.7 degrees. In other specific embodiments, inertial sensing device 530 can be configured at other angles. In a specific embodiment, one or more modules can be coupled to first sensing device 520, second sensing device 521, and inertial sensing device 530. Of course, there can be other variations, modifications, and alternatives.

In a specific embodiment, first sensing device 520 can be configured to detect at least a first direction and second sensing device 521 can be configured to detect at least a second direction. Inertial sensing device 530 can also be configured to detect at least a third direction. In other embodiments, each sensing device (520, 521, and 530) can be configured to detect one or more directions. In a specific embodiment, the one or more modules can be configured to calibrate at least first inertial sensing device 520 to inertial sensing device 530. The one or more modules can also be configured to calibrate at least second sensing device 521 to inertial sensing device 530. In other specific embodiments, the one or more modules can be configured to associate at least first sensing device 520 to inertial sensing device 530. The one or more modules can also be configured to associate at least second sensing device 521 to inertial sensing device 530. Those skilled in the art will recognize other variations, modifications, and alternatives.

In a specific embodiment, first sensing device 520 is a first gyroscope and second sensing device 521 is a second gyroscope device. The first gyroscope and the second gyroscope can comprise at least a first material such as silicon (single crystalline, polycrystalline, amorphous, etc.), or any other material and combinations thereof. Also, inertial sensing device 530 can include a quartz substrate member, or a member comprising other materials or a combination thereof. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
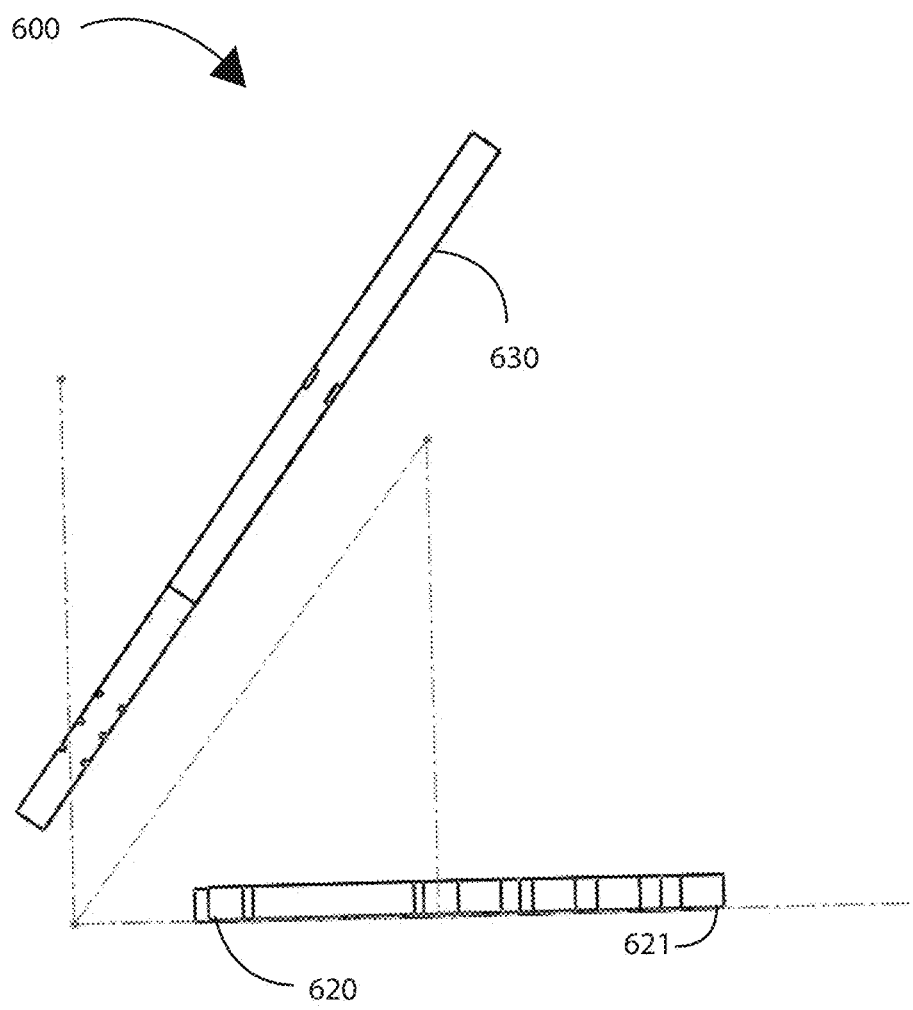
FIG. 6 is a simplified side diagram of a quartz and MEMS inertial sensing apparatus according to an embodiment of the present invention.

FIG. 6 is a simplified side diagram of a quartz and MEMS inertial sensing apparatus according to an embodiment of the present invention. This diagram is merely an example, which should not unduly limit the scope of the claims herein. One of ordinary skill in the art would recognize other variations, modifications, and alternatives. As shown, system 600 includes a first inertial sensing device 620, a second inertial sensing device 621, and an inertial sensing device 630. Those of ordinary skill in the art will recognize other variations, modifications, and alternatives.

In a specific embodiment, the inertial sensing device 630 can be operably coupled to both first sensing device 620 and the second sensing device 621. In other embodiments, inertial sensing device 630 can be coupled to only first sensing device 620 or second sensing device 621. In further embodiments, inertial sensing device 630 can be configured independently of first sensing device 620 and second sensing device 621. In a specific embodiment, first inertial sensing device 620 and second inertial sensing device 621 can be configured on the same spatial plane, such as an X-Y plane or Y-Z plane, and oriented in a perpendicular pattern on the spatial plane. In other embodiments, first sensing device 620 and second sensing device 621 can be oriented in any other pattern on the same spatial plane. In further embodiments, first sensing device 620 and second sensing device 621 can be configured on separate spatial planes (i.e., X-Y, Y-Z, X-Z). In a specific embodiment, inertial sensing device 630 can be spatially disposed between first sensing device 620 and second sensing device 621. In a specific embodiment, inertial sensing device 630 can be configured to be spatially disposed between the first sensing device 620 and second sensing device 621 at an angle of 54.7 degrees. In other specific embodiments, inertial sensing device 630 can be configured at other angles. In a specific embodiment, one or more modules can be coupled to first sensing device 620, second sensing device 621, and inertial sensing device 630. Of course, there can be other variations, modifications, and alternatives.

In a specific embodiment, first sensing device 620 can be configured to detect at least a first direction and second sensing device 621 can be configured to detect at least a second direction. Inertial sensing device 630 can also be configured to detect at least a third direction. In other embodiments, each sensing device (620, 621, and 630) can be configured to detect one or more directions. In a specific embodiment, the one or more modules can be configured to calibrate at least first inertial sensing device 620 to inertial sensing device 630. The one or more modules can also be configured to calibrate at least second sensing device 621 to inertial sensing device 630. In other specific embodiments, the one or more modules can be configured to associate at least first sensing device 620 to inertial sensing device 630. The one or more modules can also be configured to associate at least second sensing device 621 to inertial sensing device 630. Those skilled in the art will recognize other variations, modifications, and alternatives.

In a specific embodiment, first sensing device 620 is a first gyroscope and second sensing device 621 is a second gyroscope device. The first gyroscope and the second gyroscope can comprise at least a first material such as silicon (single crystalline, polycrystalline, amorphous, etc.), or any other material and combinations thereof. Also, inertial sensing device 630 can include a quartz substrate member, or a member comprising other materials or a combination thereof. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
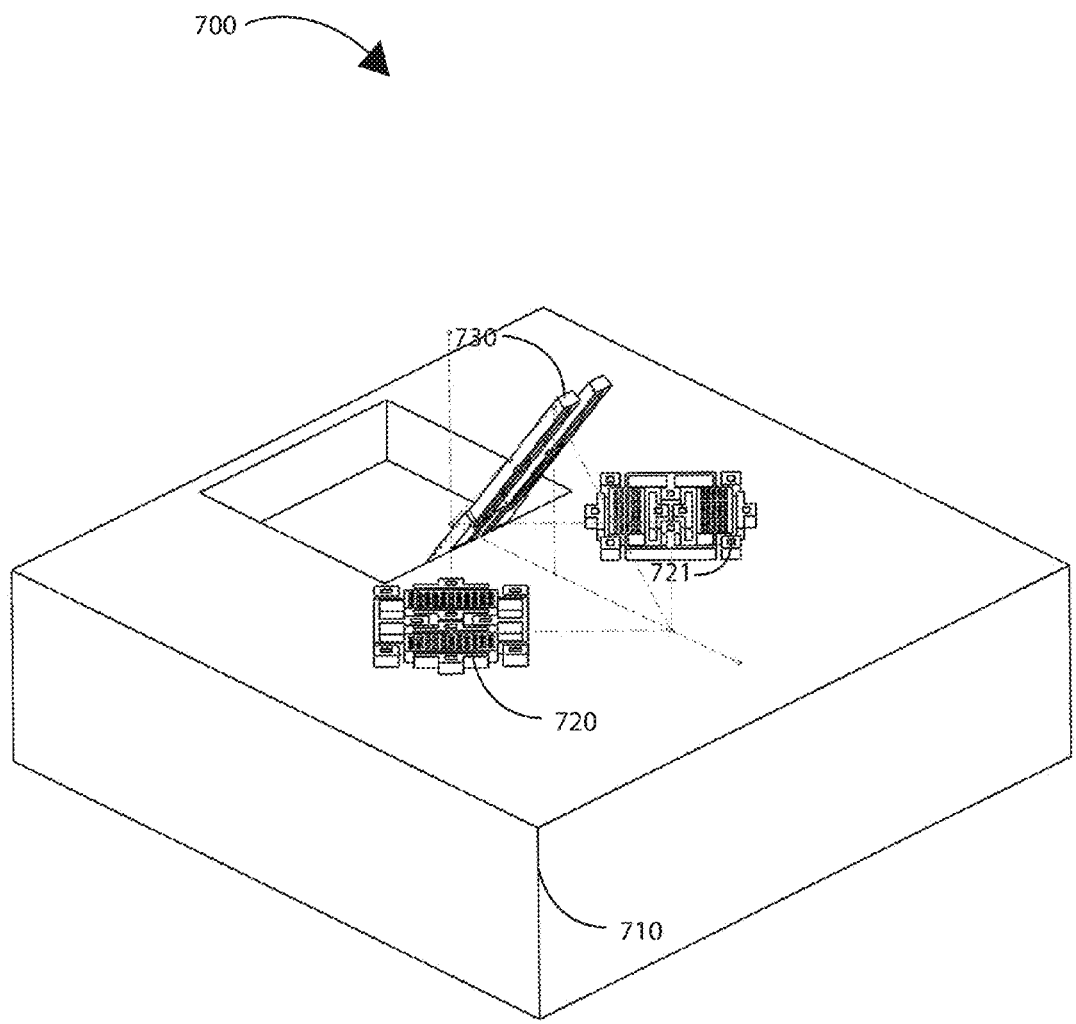
FIG. 7 is a simplified perspective diagram of a quartz and MEMS inertial sensing apparatus according to an alternative embodiment of the present invention.

FIG. 7 is a simplified perspective diagram of a quartz and MEMS inertial sensing apparatus according to an alternative embodiment of the present invention. This diagram is merely an example, which should not unduly limit the scope of the claims herein. One of ordinary skill in the art would recognize other variations, modifications, and alternatives. As shown, system 700 includes a substrate member 710, a first inertial sensing device 720, a second inertial sensing device 721, and an inertial sensing device 730. Those of ordinary skill in the art will recognize other variations, modifications, and alternatives.

In a specific embodiment, the inertial sensing device 730 can be operably coupled to both first sensing device 720 and the second sensing device 721. Both first inertial sensing device 720 and second inertial sensing device 721 can be integrated with substrate member 710. Also, inertial sensing device 730 can be coupled to substrate member 710. In other embodiments, inertial sensing device 730 can be coupled to only first sensing device 720 or second sensing device 721. In further embodiments, inertial sensing device 730 can be configured independently of first sensing device 720 and second sensing device 721. In a specific embodiment, first inertial sensing device 720 and second inertial sensing device 721 can be configured on the same spatial plane, such as an X-Y plane or Y-Z plane, and oriented in a perpendicular pattern on the spatial plane. In other embodiments, first sensing device 720 and second sensing device 721 can be oriented in any other pattern on the same spatial plane. In further embodiments, first sensing device 720 and second sensing device 721 can be configured on separate spatial planes (i.e., X-Y, Y-Z, X-Z). In a specific embodiment, inertial sensing device 730 can be spatially disposed between first sensing device 720 and second sensing device 721. In a specific embodiment, inertial sensing device 730 can be configured to be spatially disposed between the first sensing device 720 and second sensing device 721 at an angle of 54.7 degrees. In other specific embodiments, inertial sensing device 730 can be configured at other angles. In a specific embodiment, one or more modules can be coupled to first sensing device 720, second sensing device 721, and inertial sensing device 730. Of course, there can be other variations, modifications, and alternatives.

In a specific embodiment, first sensing device 720 can be configured to detect at least a first direction and second sensing device 721 can be configured to detect at least a second direction. Inertial sensing device 730 can also be configured to detect at least a third direction. In other embodiments, each sensing device (720, 721, and 730) can be configured to detect one or more directions. In a specific embodiment, the one or more modules can be configured to calibrate at least first inertial sensing device 720 to inertial sensing device 730. The one or more modules can also be configured to calibrate at least second sensing device 721 to inertial sensing device 730. In other specific embodiments, the one or more modules can be configured to associate at least first sensing device 720 to inertial sensing device 730. The one or more modules can also be configured to associate at least second sensing device 721 to inertial sensing device 730. Those skilled in the art will recognize other variations, modifications, and alternatives.

In a specific embodiment, first sensing device 720 is a first gyroscope and second sensing device 721 is a second gyroscope device. In a specific embodiment, the first gyroscope and the second gyroscope can comprise at least a first material such as silicon (single crystalline, polycrystalline, amorphous, etc.), or any other material and combinations thereof. Also, inertial sensing device 730 can include a quartz substrate member, or a member comprising other materials and combinations thereof. In a specific embodiment, substrate member 710 can include quartz, silicon, metal, or any other materials and combinations thereof. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
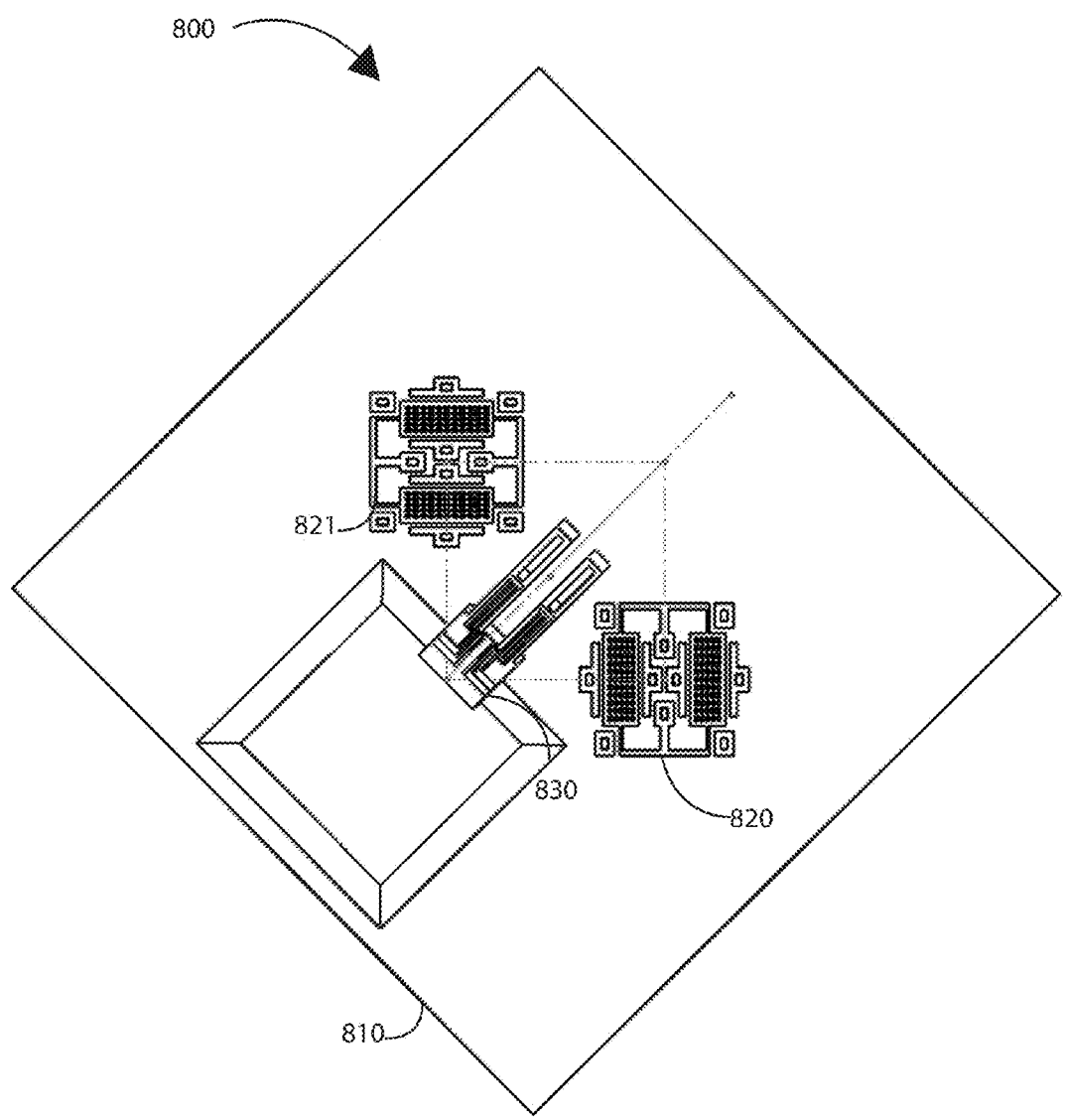
FIG. 8 is a simplified top diagram of a quartz and MEMS inertial sensing apparatus according to an alternative embodiment of the present invention.

FIG. 8 is a simplified perspective diagram of a quartz and MEMS inertial sensing apparatus according to an alternative embodiment of the present invention. This diagram is merely an example, which should not unduly limit the scope of the claims herein. One of ordinary skill in the art would recognize other variations, modifications, and alternatives. As shown, system 800 includes a substrate member 810, a first inertial sensing device 820, a second inertial sensing device 821, and an inertial sensing device 830. Those of ordinary skill in the art will recognize other variations, modifications, and alternatives.

In a specific embodiment, the inertial sensing device 830 can be operably coupled to both first sensing device 820 and the second sensing device 821. Both first inertial sensing device 820 and second inertial sensing device 821 can be integrated with substrate member 810. Also, inertial sensing device 830 can be coupled to substrate member 810. In other embodiments, inertial sensing device 830 can be coupled to only first sensing device 820 or second sensing device 821. In further embodiments, inertial sensing device 830 can be configured independently of first sensing device 820 and second sensing device 821. In a specific embodiment, first inertial sensing device 820 and second inertial sensing device 821 can be configured on the same spatial plane, such as an X-Y plane or Y-Z plane, and oriented in a perpendicular pattern on the spatial plane. In other embodiments, first sensing device 820 and second sensing device 821 can be oriented in any other pattern on the same spatial plane. In further embodiments, first sensing device 820 and second sensing device 821 can be configured on separate spatial planes (i.e., X-Y, Y-Z, X-Z). In a specific embodiment, inertial sensing device 830 can be spatially disposed between first sensing device 820 and second sensing device 821. In a specific embodiment, inertial sensing device 830 can be configured to be spatially disposed between the first sensing device 820 and second sensing device 821 at an angle of 54.7 degrees. In other specific embodiments, inertial sensing device 830 can be configured at other angles. In a specific embodiment, one or more modules can be coupled to first sensing device 820, second sensing device 821, and inertial sensing device 830. Of course, there can be other variations, modifications, and alternatives.

In a specific embodiment, first sensing device 820 can be configured to detect at least a first direction and second sensing device 821 can be configured to detect at least a second direction. Inertial sensing device 830 can also be configured to detect at least a third direction. In other embodiments, each sensing device (820, 821, and 830) can be configured to detect one or more directions. In a specific embodiment, the one or more modules can be configured to calibrate at least first inertial sensing device 820 to inertial sensing device 830. The one or more modules can also be configured to calibrate at least second sensing device 821 to inertial sensing device 830. In other specific embodiments, the one or more modules can be configured to associate at least first sensing device 820 to inertial sensing device 830. The one or more modules can also be configured to associate at least second sensing device 821 to inertial sensing device 830. Those skilled in the art will recognize other variations, modifications, and alternatives.

In a specific embodiment, first sensing device 820 is a first gyroscope and second sensing device 821 is a second gyroscope device. In a specific embodiment, the first gyroscope and the second gyroscope can comprise at least a first material such as silicon (single crystalline, polycrystalline, amorphous, etc.), or any other material and combinations thereof. Also, inertial sensing device 830 can include a quartz substrate member, or a member comprising other materials and combinations thereof. In a specific embodiment, substrate member 810 can include quartz, silicon, metal, or any other materials and combinations thereof. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
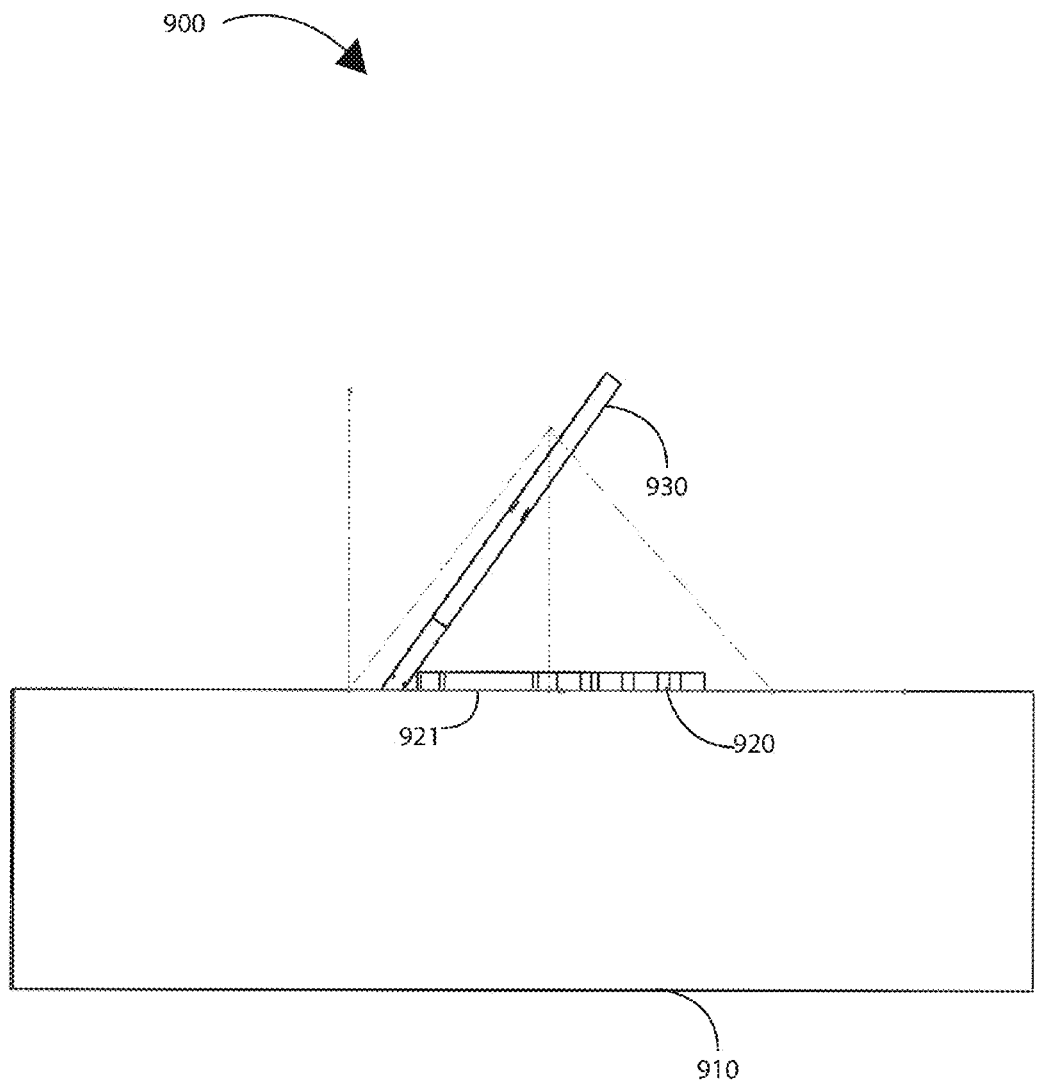
FIG. 9 is a simplified side diagram of a quartz and MEMS inertial sensing apparatus according to an alternative embodiment of the present invention.

FIG. 9 is a simplified perspective diagram of a quartz and MEMS inertial sensing apparatus according to an alternative embodiment of the present invention. This diagram is merely an example, which should not unduly limit the scope of the claims herein. One of ordinary skill in the art would recognize other variations, modifications, and alternatives. As shown, system 900 includes a substrate member 910, a first inertial sensing device 920, a second inertial sensing device 921, and an inertial sensing device 930. Those of ordinary skill in the art will recognize other variations, modifications, and alternatives.

In a specific embodiment, the inertial sensing device 930 can be operably coupled to both first sensing device 920 and the second sensing device 921. Both first inertial sensing device 920 and second inertial sensing device 921 can be integrated with substrate member 910. Also, inertial sensing device 930 can be coupled to substrate member 910. In other embodiments, inertial sensing device 930 can be coupled to only first sensing device 920 or second sensing device 921. In further embodiments, inertial sensing device 930 can be configured independently of first sensing device 920 and second sensing device 921. In a specific embodiment, first inertial sensing device 920 and second inertial sensing device 921 can be configured on the same spatial plane, such as an X-Y plane or Y-Z plane, and oriented in a perpendicular pattern on the spatial plane. In other embodiments, first sensing device 920 and second sensing device 921 can be oriented in any other pattern on the same spatial plane. In further embodiments, first sensing device 920 and second sensing device 921 can be configured on separate spatial planes (i.e., X-Y, Y-Z, X-Z). In a specific embodiment, inertial sensing device 930 can be spatially disposed between first sensing device 920 and second sensing device 921. In a specific embodiment, inertial sensing device 930 can be configured to be spatially disposed between the first sensing device 920 and second sensing device 921 at an angle of 54.7 degrees. In other specific embodiments, inertial sensing device 930 can be configured at other angles. In a specific embodiment, one or more modules can be coupled to first sensing device 920, second sensing device 921, and inertial sensing device 930. Of course, there can be other variations, modifications, and alternatives.

In a specific embodiment, first sensing device 920 can be configured to detect at least a first direction and second sensing device 921 can be configured to detect at least a second direction. Inertial sensing device 930 can also be configured to detect at least a third direction. In other embodiments, each sensing device (920, 921, and 930) can be configured to detect one or more directions. In a specific embodiment, the one or more modules can be configured to calibrate at least first inertial sensing device 920 to inertial sensing device 930. The one or more modules can also be configured to calibrate at least second sensing device 921 to inertial sensing device 930. In other specific embodiments, the one or more modules can be configured to associate at least first sensing device 920 to inertial sensing device 930. The one or more modules can also be configured to associate at least second sensing device 921 to inertial sensing device 930. Those skilled in the art will recognize other variations, modifications, and alternatives.

In a specific embodiment, first sensing device 920 is a first gyroscope and second sensing device 921 is a second gyroscope device. In a specific embodiment, the first gyroscope and the second gyroscope can comprise at least a first material such as silicon (single crystalline, polycrystalline, amorphous, etc.), or any other material and combinations thereof. Also, inertial sensing device 930 can include a quartz substrate member, or a member comprising other materials and combinations thereof. In a specific embodiment, substrate member 910 can include quartz, silicon, metal, or any other materials and combinations thereof. As said before, there can be other variations, modifications, and alternatives.

Figure 10:
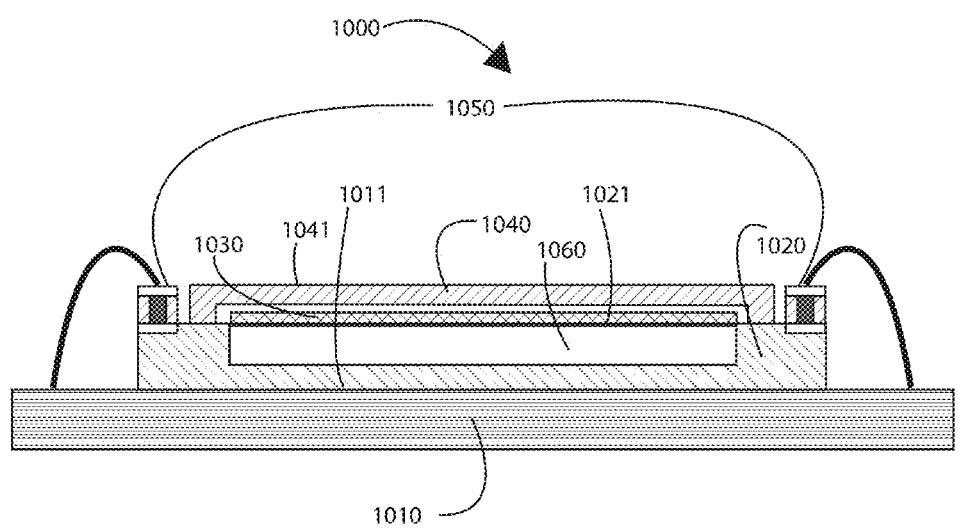
FIG. 10 is a simplified system diagram of an electronic packaging according to an embodiment of the present invention.

FIG. 10 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 1000 includes a substrate member 1010, a semiconductor substrate 1020, one or more MEMS devices 1030, an enclosure 1040, and one or more bonding structures 1050. The substrate member 1010 can have a surface region 1011. In an embodiment, the substrate 1010 can be a semiconductor, metal, a dielectric, or any other material type. Also, the substrate 1010 can comprise a PCB, a lead frame, a silicon material, or others. In a specific embodiment, the semiconductor substrate 1020 can comprise one or more integrated circuits 1060. Also, the semiconductor substrate 1020 can be bonded to a portion of the surface region 1011 of the substrate member 1010. The semiconductor substrate 1020 can have an upper surface region 1021. In a specific embodiment, the semiconductor substrate 1020 is characterized by a thickness of about 600 to about 800 microns. There can be other variations, modifications, and alternatives to the substrates described herein.

In an embodiment, the one or more MEMS devices 1030 overlie an inner region of the upper surface region 1021 formed by the semiconductor substrate 1020. The one or more MEMS devices 1030 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the upper surface region 1021 formed by the semiconductor substrate 1020 can comprise a dielectric material, and others. Also, the upper surface region 1021 can comprise an inner region, a first outer region, and a second outer region. In an embodiment, the first outer region and second outer region is characterized by a width of about 200 microns or less and 100 microns or less, respectively. In a specific embodiment, the enclosure 1040 can house the one or more MEMS devices 1030. The enclosure 1040 can overlie the first outer region of the upper surface region 1021. Also, the enclosure 1040 can have an upper cover region 1041. In an embodiment, an opening can be provided between the enclosure 1040 and the one or more MEMS devices 1030. In various embodiments, the opening can be filled with one or more gasses. Of course, there can be other variations, modifications, and alternatives.

In a specific embodiment, the one or more bonding structures 1050 can each have a bonding pad within a vicinity of the upper cover region 1041 formed by the enclosure 1040. The one or more bonding structures 1050 can also be provided within a second outer region of the upper surface region 1021. In a specific embodiment, each of the bonding structures 1050 can comprise a bonding pad, a via structure, and a pad structure. The pad structure can be integrally coupled to the one or more integrated circuits 1060. Of course, there can be other variations, modifications, and alternatives.

Figure 11:
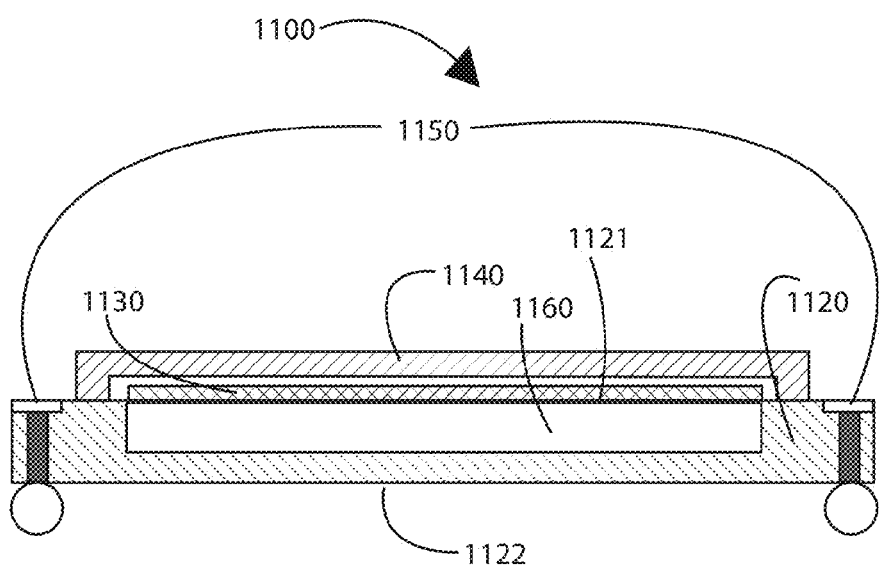
FIG. 11 is a simplified system diagram of an electronic packaging according to an embodiment of the present invention.

FIG. 11 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 1100 includes a semiconductor substrate 1120, one or more MEMS devices 1130, an enclosure 1140, and one or more bonding structures 1150. In a specific embodiment, the semiconductor substrate 1120 can comprise one or more integrated circuits 1160. The semiconductor substrate 1120 can have a surface region 1121 and a backside region 1122. The surface region 1121 can comprise an inner region, a first outer region, and a second outer region. In a specific embodiment, the semiconductor substrate 1120 is characterized by a thickness of about 600 to about 800 microns. Additionally, the surface region 1121 can comprise a dielectric material, and others. There can be other variations, modifications, and alternatives to the substrates described herein.

In an embodiment, the one or more MEMS devices 1130 overlie an inner region of the surface region 1121 formed by the semiconductor substrate 1120. The one or more MEMS devices 1130 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the surface region 1121 formed by the semiconductor substrate 1120 can comprise a dielectric material, and others. Also, the surface region 1121 can comprise an inner region, a first outer region, and a second outer region. In an embodiment, the first outer region and second outer region is characterized by a width of about 200 microns or less and 100 microns or less, respectively. In a specific embodiment, the enclosure 1140 can house the one or more MEMS devices 1130. The enclosure 1140 can overlie the first outer region of the surface region 1121. In an embodiment, an opening can be provided between the enclosure 1140 and the one or more MEMS devices 1130. In various embodiments, the opening can be filled with one or more gasses. Of course, there can be other variations, modifications, and alternatives.

In a specific embodiment, the one or more bonding structures 1150 can be provided through a thickness of the semiconductor substrate 1120. The one or more bonding structures 1150 can also be configured to overlie the second outer region of the surface region 1121. In a specific embodiment, each of the bonding structures 1150 can comprise a bonding pad, a via structure, and a pad structure. The bonding pad can be provided within a vicinity of the first outer region, and the second bonding pad can be provided within a portion of the backside region 1122. Of course, there can be other variations, modifications, and alternatives.

Figure 12:
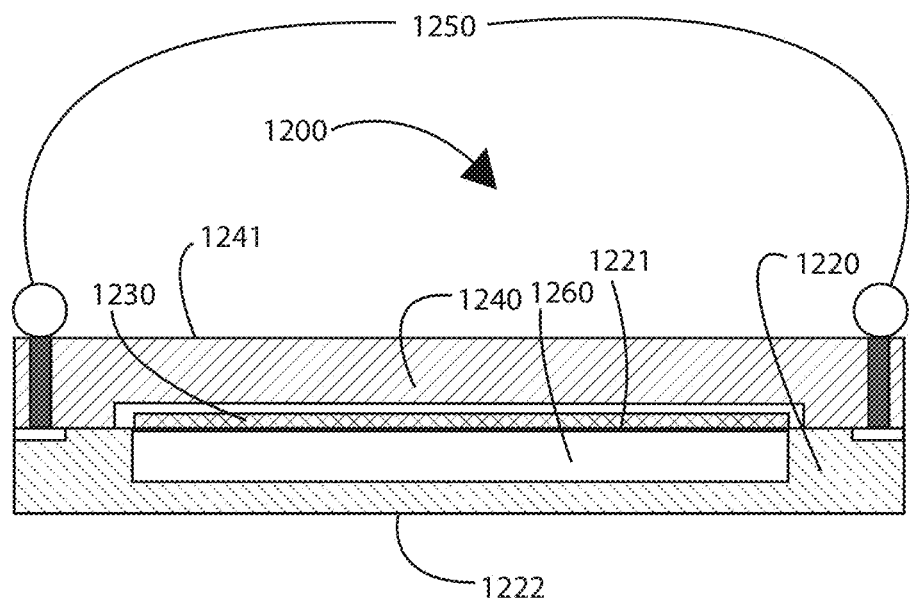
FIG. 12 is a simplified system diagram of an electronic packaging according to an embodiment of the present invention.

FIG. 12 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 1200 includes a semiconductor substrate 1220, one or more MEMS devices 1230, an enclosure 1240, and one or more bonding structures 1250. In a specific embodiment, the semiconductor substrate 1220 can comprise one or more integrated circuits 1260. The semiconductor substrate 1220 can have a surface region 1221 and a backside region 1222. The surface region 1221 can comprise an inner region and a first outer region. In a specific embodiment, the semiconductor substrate 1220 is characterized by a thickness of about 600 to about 800 microns. Additionally, the surface region 1221 can comprise a dielectric material, and others. There can be other variations, modifications, and alternatives to the substrates described herein.

In an embodiment, the one or more MEMS devices 1230 overlie an inner region of the surface region 1221 formed by the semiconductor substrate 1220. The one or more MEMS devices 1230 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the surface region 1221 formed by the semiconductor substrate 1220 can comprise a dielectric material, and others. Also, the surface region 1221 can comprise an inner region, a first outer region, and a second outer region. In an embodiment, the first outer region and second outer region is characterized by a width of about 200 microns or less and 100 microns or less, respectively. In a specific embodiment, the enclosure 1240 can house the one or more MEMS devices 1230. The enclosure 1240 can overlie the first outer region of the surface region 1221. Also, the enclosure can have an upper cover region 1241. In an embodiment, an opening can be provided between the enclosure 1240 and the one or more MEMS devices 1230. In various embodiments, the opening can be filled with one or more gasses. Of course, there can be other variations, modifications, and alternatives.

In a specific embodiment, the one or more bonding structures 1250 can be provided through a thickness of the semiconductor substrate 1220. The one or more bonding structures 1250 can also be configured to overlie the first outer region of the surface region 1221. In a specific embodiment, each of the bonding structures 1250 can comprise a bonding pad, a via structure, and a pad structure. The bonding pad can be provided within a vicinity of the first outer region, and the second bonding pad can be provided within a portion of the upper cover region 1241. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for inertial sensing, the apparatus comprising:
   a substrate member comprising a thickness of material and a surface region;
   a first surface region configured from a first crystallographic plane of the substrate member;

a second plane region configured from a second crystallographic plane of the substrate member, wherein the first crystallographic plane and the second crystallographic plane form an acute angle;
a quartz inertial sensing device coupled to the first surface region;
one or more MEMS inertial sensing devices coupled to the second plane region;
an enclosure housing the one or more MEMS inertial sensing devices and the quartz inertial sensing device and configured overlying a first outer region of the surface region, the enclosure housing have an upper cover region; and
one or more bonding structures, each of the bonding structures having a bonding pad within a vicinity of the upper cover region and provided within a second outer region of the surface region,
wherein the second outer region is characterized by a width of about 100 microns and less, and wherein the first outer region is characterized by a width of about 200 microns and less.

2. The apparatus of claim 1 wherein the one or more MEMS inertial sensing devices comprises at least a portion being configured in a region underlying the quartz inertial sensing device.

3. The apparatus of claim 1 further comprising one or more integrated circuit (IC) devices coupled to the second plane region.

4. The apparatus of claim 3 wherein the one or more IC devices are application specific integrated circuit (ASIC) devices.

5. The apparatus of claim 3 wherein the one or more IC devices are coupled to at least the quartz inertial sensing device.

6. The apparatus of claim 3 wherein the one or more IC devices are configured using a silicon-on-insulator (SOI) substrate.

7. The apparatus of claim 3 wherein the one or more IC devices comprises at least a portion being configured in a region underlying the quartz inertial sensing device.

8. The apparatus of claim 1 wherein the second plane region comprises one or more plane regions configured from the second crystallographic plane of the substrate member.

9. The apparatus of claim 1 wherein the first crystallographic plane of the substrate member and the second crystallographic plane of the substrate member are configured at an angle excluding 90 degrees.

10. The apparatus of claim 1 wherein the first crystallographic plane of the substrate member and the second crystallographic plane of the substrate member form an acute angle of 54.7 degrees.

11. The apparatus of claim 1 wherein the second plane region is formed via a wet etching process.

12. The apparatus of claim 1 wherein the thickness of material comprises silicon, single crystal silicon, or polysilicon.

13. The apparatus of claim 1 wherein the one or more MEMS inertial sensing devices are integrated MEMS and IC devices.

14. The apparatus of claim 1 wherein the one or more MEMS inertial sensing devices comprises one or more single or multiple axis MEMS gyroscope devices.

15. The apparatus of claim 1 wherein the one or more MEMS inertial sensing devices comprises one or more a single or multiple axis MEMS accelerometer devices.

16. The apparatus of claim 1 wherein the quartz inertial sensing device and the one or more MEMS inertial sensing devices are sealed in vacuum.

17. The apparatus of claim 1 wherein the quartz inertial sensing device is coupled to the first surface region via a quartz soldering process.

18. An apparatus for inertial sensing, the apparatus comprising:
a substrate member comprising one or more IC devices, the substrate member having a surface region and a backside region, the surface region comprising an inner region, a first outer region, and a second outer region;
a first surface region configured from a first crystallographic plane of the substrate member;
a second plane region configured from a second crystallographic plane of the substrate, wherein the first crystallographic plane of the substrate member and the second crystallographic plane of the substrate member forms an acute angle of 54.7 degrees, wherein the one or more IC devices is coupled to the second plane region;
a quartz inertial sensing device coupled to the first surface region;
one or more MEMS inertial sensing devices coupled to the second plane region, the one or more MEMS inertial sensing devices comprising at least a portion being configured in a region underlying the quartz inertial sensing device, wherein the quartz inertial sensing device and the one or more MEMS inertial sensing devices are configured overlying the inner region of the surface region;
an enclosure housing the quartz inertial sensing device and the one or more MEMS inertial sensing devices and configured overlying the first outer region of the surface region; and
one or more bonding structures provided through a thickness of the substrate member and configured overlying the second outer region, each of the bonding structures having a first bonding pad within a vicinity of the first outer region, a via structure, and a second bonding pad provided within a portion of the backside region.

19. The apparatus of claim 18 wherein the second plane region comprises one or more plane regions configured from the second crystallographic plane of the substrate member.

20. The apparatus of claim 18 wherein the one or more IC devices are application specific integrated circuit (ASIC) devices.

21. The apparatus of claim 18 wherein the one or more IC devices are coupled to at least the quartz inertial sensing device.

22. The apparatus of claim 18 wherein the one or more IC devices are configured using a silicon-on-insulator (SOI) substrate.

23. The apparatus of claim 18 wherein the first crystallographic plane of the substrate member and the second crystallographic plane of the substrate member are configured at an angle excluding 90 degrees.

24. The apparatus of claim 18 wherein the second plane region is formed via a wet etching process.

25. The apparatus of claim 18 wherein the thickness of material comprises silicon, single crystal silicon, or polysilicon.

26. The apparatus of claim 18 wherein the one or more MEMS inertial sensing devices are integrated MEMS and IC devices.

27. The apparatus of claim 18 wherein the one or more MEMS inertial sensing devices comprises one or more single or multiple axis MEMS gyroscope devices.

28. The apparatus of claim 18 wherein the one or more MEMS inertial sensing devices comprises one or more a single or multiple axis MEMS accelerometer devices.

29. The apparatus of claim 18 wherein devices coupled to the first surface region or the second plane region are sealed in vacuum.

30. The apparatus of claim 18 wherein the quartz inertial sensing device is coupled to the first surface region via a quartz soldering process.

31. An apparatus for inertial sensing, the apparatus comprising:
- a semiconductor substrate comprising a surface region, the surface region comprising an inner region and a first outer region;
- a first surface region configured from a first crystallographic plane of the substrate;
- a second plane region configured from a second crystallographic plane of the substrate, the second plane region comprising one or more plane regions configured from the second crystallographic plane of the substrate, the second plane region being formed via a wet etching process, the second crystallographic plane of the substrate and the first crystallographic plane of the substrate providing an acute angle of 54.7 degrees;
- a quartz inertial sensing device coupled to the first surface region, the quartz inertial sensing device being coupled to the first surface region via a quartz soldering process, the quartz inertial sensing device being configured overlying the inner region of the surface region;
- a first single-axis MEMS gyroscope device coupled to the second plane region, the first single-axis MEMS gyroscope device comprising at least a portion being configured in a region underlying the quartz inertial sensing device, the first single-axis MEMS gyroscope device being configured overlying the inner region of the surface region;
- a second single-axis MEMS gyroscope device coupled to the second plane region, the second single-axis MEMS gyroscope device comprising at least a portion being configured in a region underlying the quartz inertial sensing device, the second single-axis MEMS gyroscope device being configured overlying the inner region of the surface region;
- a three-axis MEMS accelerometer device coupled to the second plane region, the three-axis MEMS accelerometer device comprising at least a portion being configured in a region underlying the quartz inertial sensing device, the three-axis MEMS accelerometer device being configured overlying the inner region of the surface region;
- an ASIC device coupled to the second plane region, the ASIC device being configured using an SOI substrate, the ASIC device comprising at least a portion being configured in a region underlying the quartz inertial sensing device, the ASIC device being coupled to at least the quartz inertial sensing device, and the devices coupled to the first surface region and the second plane region are sealed in a vacuum;
- an enclosure having an upper cover region, the enclosure housing the quartz inertial sensing device, the first and second single-axis MEMS gyroscope devices, and the three-axis MEMS accelerometer device, the enclosure being configured overlying the first outer region of the surface region; and
- one or more bonding structures provided through a thickness of the enclosure housing and configured overlying the first outer region, each of the bonding structures having a first bonding pad within a vicinity of the first outer region, a via structure, and a second bonding pad provided within a portion of the upper cover region of the enclosure housing.

\* \* \* \* \*